(12) United States Patent
Kim et al.

(10) Patent No.: US 8,194,496 B2
(45) Date of Patent: Jun. 5, 2012

(54) CIRCUIT AND METHOD FOR RECOVERING CLOCK DATA IN HIGHLY INTEGRATED SEMICONDUCTOR MEMORY APPARATUS

(75) Inventors: Kyung-Hoon Kim, Kyoungki-do (KR); Sang-Yeon Byeon, Kyoungki-do (KR); Chang-Kyu Choi, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 13/105,431

(22) Filed: May 11, 2011

(65) Prior Publication Data
US 2011/0210779 A1    Sep. 1, 2011

Related U.S. Application Data

(62) Division of application No. 12/157,287, filed on Jun. 9, 2008, now Pat. No. 7,965,582.

(30) Foreign Application Priority Data

Nov. 2, 2007    (KR) .................. 10-2007-0111482

(51) Int. Cl.
*G11C 8/18* (2006.01)
(52) U.S. Cl. .......... 365/233.11; 365/189.07; 365/233.12
(58) Field of Classification Search .............. 365/233.11, 365/233.12, 191, 194, 189.05, 189.07; 327/156–159, 327/295–298, 262
See application file for complete search history.

(56) References Cited

U.S. PATENT DOCUMENTS

| | | | |
|---|---|---|---|
| 6,265,996 B1 | 7/2001 | Duffy | |
| 6,535,527 B1 | 3/2003 | Duffy | |
| 2003/0223527 A1* | 12/2003 | Otomo | 375/376 |
| 2004/0172570 A1 | 9/2004 | Miyajiri | |
| 2007/0222488 A1 | 9/2007 | Bonaccio et al. | |
| 2009/0116601 A1* | 5/2009 | Kim et al. | 375/371 |

FOREIGN PATENT DOCUMENTS

| | | |
|---|---|---|
| KR | 1999-0077790 | 10/1999 |
| KR | 2002-0050730 | 6/2002 |
| KR | 2007-0098713 A | 10/2007 |

* cited by examiner

*Primary Examiner* — Anh Phung
*Assistant Examiner* — Hien Nguyen
(74) *Attorney, Agent, or Firm* — Blakely, Sokoloff, Taylor & Zafman

(57) ABSTRACT

Circuit and method for recovering clock data in highly integrated semiconductor memory apparatus includes a plurality of signal receiving units configured to receive signals through a plurality of input/output pads and transfer the signals according to a receiving reference clock, the signal receiving units being divided into groups, a plurality of phase detection units configured to detect phases of signals output from the groups of the signal receiving units, a plurality of phase detection control units configured to control the phase detection units so that the phase detection units sequentially detect the phases of the signals output from each of the groups of the signal receiving units and a notification unit configured to output signals output from the phase detection units.

3 Claims, 6 Drawing Sheets

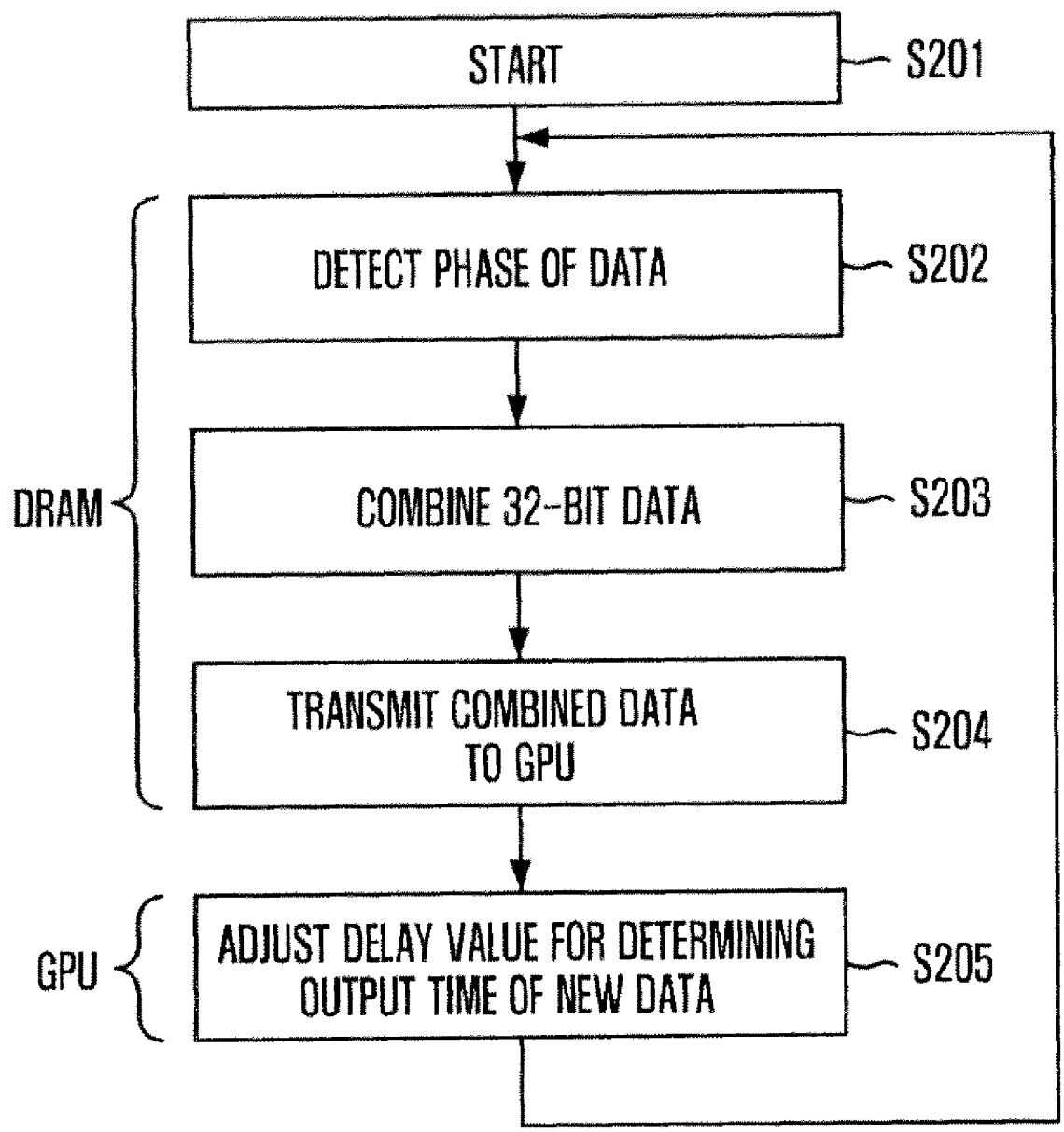

CIRCUIT AND METHOD FOR RECOVERING CLOCK DATA IN HIGHLY INTEGRATED SEMICONDUCTOR MEMORY APPARATUS

CROSS-REFERENCE TO RELATED APPLICATION

The present patent application is a Divisional application claiming the benefit of application Ser. No. 12/157,287, filed Jun. 9, 2008 now U.S. Pat. No. 7,965,582.

CROSS-REFERENCE TO RELATED APPLICATIONS

The present invention claims priority of Korean patent application number 10-2007-0111482, filed on Nov. 2, 2007, which is incorporated by reference in its entirety.

BACKGROUND OF THE INVENTION

The present invention relates to a highly integrated semiconductor device, and more particularly, to a semiconductor memory device including a clock data recovery (CDR) circuit for recovering signals and data distorted during high-speed processing.

Semiconductor memory devices are used for storing data in various systems such as a system composed of a plurality of semiconductor devices. When a data processing device, such as a central processing unit (CPU), requests or sends data, a semiconductor memory device outputs or stores the data based on address information received from the data processing device.

As the operating speed of a semiconductor device system increases owing to the advance of semiconductor integrated circuit technology, the semiconductor device system requires high-speed semiconductor memory devices capable of rapidly outputting and storing data. For high-speed and stable operations of a semiconductor memory device, circuits of the semiconductor memory device need to be operated at a high speed. That is, the circuits of the semiconductor memory device need to process signals or data rapidly and transfer the signals or data at a high speed.

As the operating speed of semiconductor memory devices need to be high for being used in high-speed systems, the signal/data transmission speed of interfaces is also required to be high. A clock data recovery (CDR) method has been developed to prevent malfunctions or instable operations of a semiconductor memory device caused by noises, interferences, and distortions of signals and data.

That is, a recent semiconductor memory device includes a CDR circuit for reliably transferring signals and data at a high speed. CDR technology is used in most high-speed systems for recovering original data and clock signals from data and clock signals distorted or changed during transmission.

In a semiconductor memory device, transmission of data and clock signals can be delayed due to various reasons. In this case, the semiconductor memory device cannot normally operate according to the data and clock signals, and thus the possibility of malfunction of the semiconductor memory device increases. To solve these problems, circuits of the semiconductor memory device can be operated according to an inner clock produced corresponding to an external reference clock. When the inner clock is not in phase with the external reference clock, the phase difference is detected and reported to the circuits so as to allow the circuits to change the phase of the inner clock in response to the reported phase difference or operate in consideration of the phase difference.

The above-described operation can be performed using a CDR circuit. For this, the CDR circuit includes a phase comparator and a filter. The phase comparator detects a difference between the external reference clock and the inner clock, and the detection result is output through the filter.

FIG. 1 is a block diagram illustrating a conventional semiconductor memory device including CDR circuits.

Referring to FIG. 1, for example, the semiconductor memory device includes first to thirty second data pads DQ0 to D31, and first to thirty second CDR circuits 120_0 to 120_31 respectively connected to the first to thirty second data pads DQ0 to D31. The first CDR circuit 120_0 includes a receiver 122_0, a sampling unit 124_0, a delay unit 128_0, and a phase detection unit 126_0. The other CDR circuits 120_1 to 120_31 have the same elements. Thus, descriptions of the other CDR circuits 120_1 to 120_31 will be omitted.

Each of the first to thirty second CDR circuits 120_0 to 120_31 connected to the first to thirty second data pads DQ0 to D31 can recover clock data with no aid from other devices. This will now be described using the first CDR circuit 120_0 as an example. The receiver 122_0 receives a signal through the first data pad DQ0 and transfers the signal to the sampling unit 124_0. First, the sampling unit 124_0 transfers the signal to the phase detection unit 126_0 according to a receiving reference clock RX_CLK. The phase detection unit 126_0 detects transition time points of signals transferred from the sampling unit 124_0 (that is, time points at which successively transferred signals change from a logic high level to a logic low level, or from a logic low level to a logic high level). Then, the phase detection unit 126_0 calculates a delay value so as to place the transition time points on the centers of rising and falling edges of the receiving reference clock RX_CLK. The delay unit 128_0 delays the receiving reference clock RX_CLK according to the delay value so as to adjust the phase of the receiving reference clock RX_CLK. Then, the sampling unit 1240 transfers signals transferred from the receiver 1220 to an inner unit of the semiconductor memory device according to the phase-adjusted receiving reference clock RX_CLK. Since the phase of the receiving reference clock RX_CLK can be adjusted as described above, signal input/output errors can be prevented when the semiconductor memory device receives and transfers signals at a high speed.

Each of the first to thirty second CDR circuits 120_0 to 120_31 connected to the first to thirty second data pads DQ0 to D31 includes a clock generator (not shown). The clock generator generates a receiving reference clock RX_CLK that is used for determining the time for recognizing input signals.

Since the first to thirty second data pads DQ0 to D31 can have different data transmission delay levels, the first to thirty second CDR circuits 120_0 to 120_31 are connected to the first to thirty second data pads DQ0 to D31, respectively. However, the first to thirty second CDR circuits 120_0 to 120_31 occupy a large area of the semiconductor memory device. Therefore, the number of data transmission channels of the semiconductor memory device may be limited, or the power consumption of the semiconductor memory device may be increased due to the CDR operation.

SUMMARY OF THE INVENTION

Embodiments of the present invention are directed to providing an apparatus and method for improving a clock data recover (CDR) circuit of a highly integrated semiconductor memory apparatus so as to be usefully used in a highly integrated semiconductor apparatus, an electronic device, and an electronic system, the apparatus and method being configured to recover clock data using a small space and power by grouping signal input/output pads and allowing each of the groups to share a clock data recovery (CDR) circuit.

In accordance with an aspect of the present invention, there is provided a plurality of signal receiving units configured to receive signals through a plurality of input/output pads and transfer the signals according to a receiving reference clock, the signal receiving units being divided into groups, a plurality of phase detection units configured to detect phases of signals output from the groups of the signal receiving units, a plurality of phase detection control units configured to control the phase detection units so that the phase detection units sequentially detect the phases of the signals output from each of the groups of the signal receiving units and a notification unit configured to output signals output from the phase detection units. In accordance with another aspect of the present invention, there is provided a semiconductor memory apparatus configured to detect phases of parallel signals received according to a receiving reference clock and convert the detection result into a serial signal; and a data processing apparatus configured to detect a signal transmission state using the serial signal received from the semiconductor memory apparatus and adjust output times of new signals to be transferred to the semiconductor memory apparatus. In accordance with an aspect of the present invention, there is provided a method for recovering clock data that includes a step of generating a first serial signal by combining first signals received through even numbered input/output pads after detecting phases of the first signals, a step of generating a second serial signal by combining second signals received through odd numbered input/output pads after detecting phases of the second signals, a step of transferring a serialized signal produced by combining the first and second serial signals and adjusting output times of new signals based on a signal transmission state detected using the serialized signal.

BRIEF DESCRIPTION OF THE DRAWINGS

FIG. 2B is a flowchart for explaining operations of the semiconductor memory apparatus and the data processing apparatus of FIG. 2A, in accordance with an embodiment of the present invention.

DESCRIPTION OF SPECIFIC EMBODIMENTS

Hereinafter, circuit and method for recovering clock data in highly integrated semiconductor memory apparatus in accordance with the present invention will be described in detail with reference to the accompanying drawings.

Figure 2A:
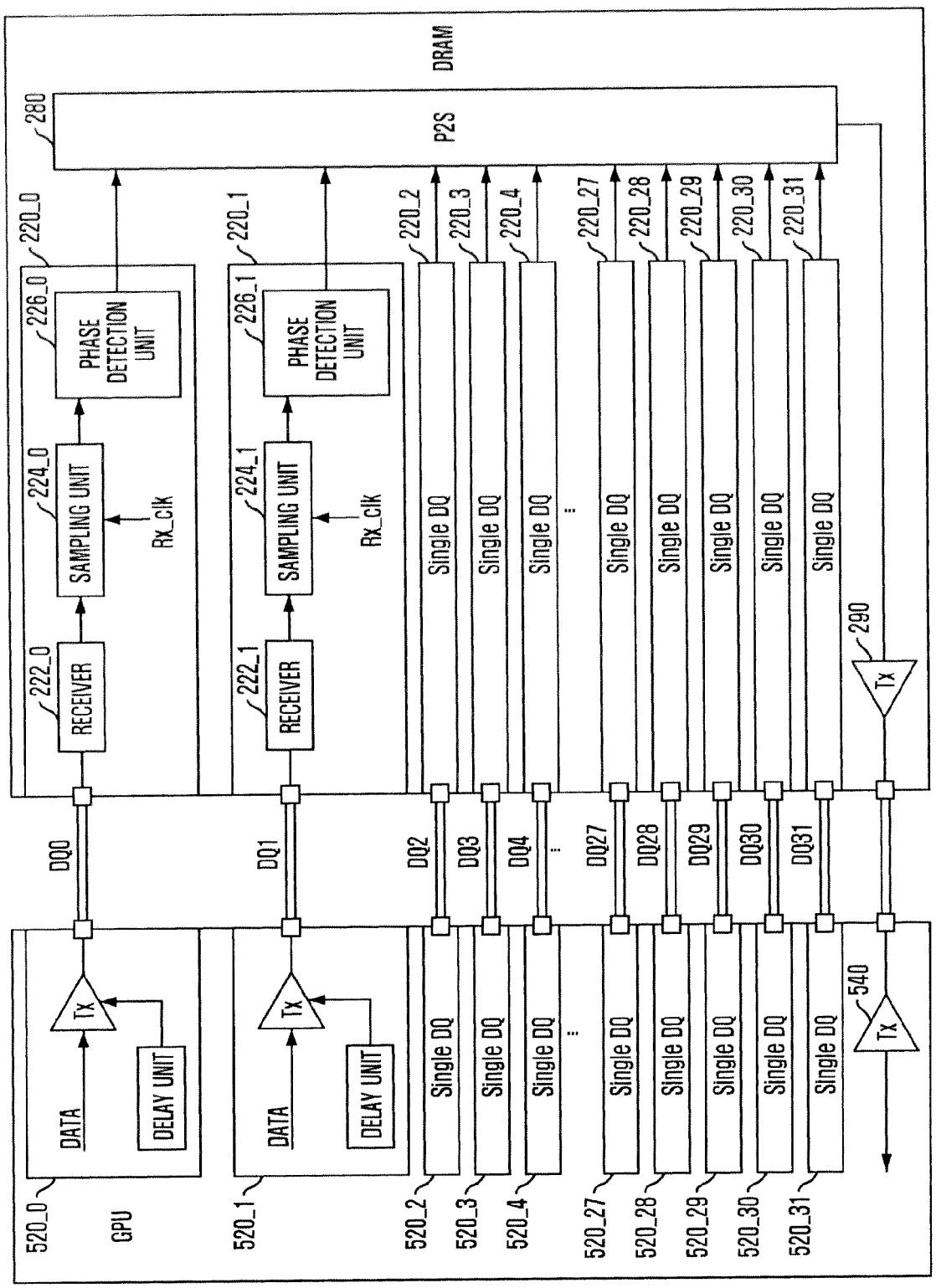
FIG. 2A is a block diagram illustrating a semiconductor memory apparatus and a data processing apparatus in accordance with an embodiment of the present invention.

FIG. 2A is a block diagram illustrating a semiconductor memory apparatus and a data processing apparatus in accordance with an embodiment of the present invention.

Referring to FIG. 2A, the semiconductor memory apparatus may be a dynamic random access memory (DRAM). The semiconductor memory apparatus receives a plurality of parallel signals according to a receiving reference clock signal and detects phases of the signals. Then, the semiconductor memory apparatus converts the detection result into a serial signal. The data processing apparatus may be a general processing unit (GPU). The data processing apparatus detects a signal transmission state using the serial signal received from the semiconductor memory apparatus. Then, the data processing apparatus controls output times of new signals to be transferred to the semiconductor memory apparatus. The semiconductor memory apparatus and the data processing apparatus can form a system capable of clock data recovery.

Figure 1:
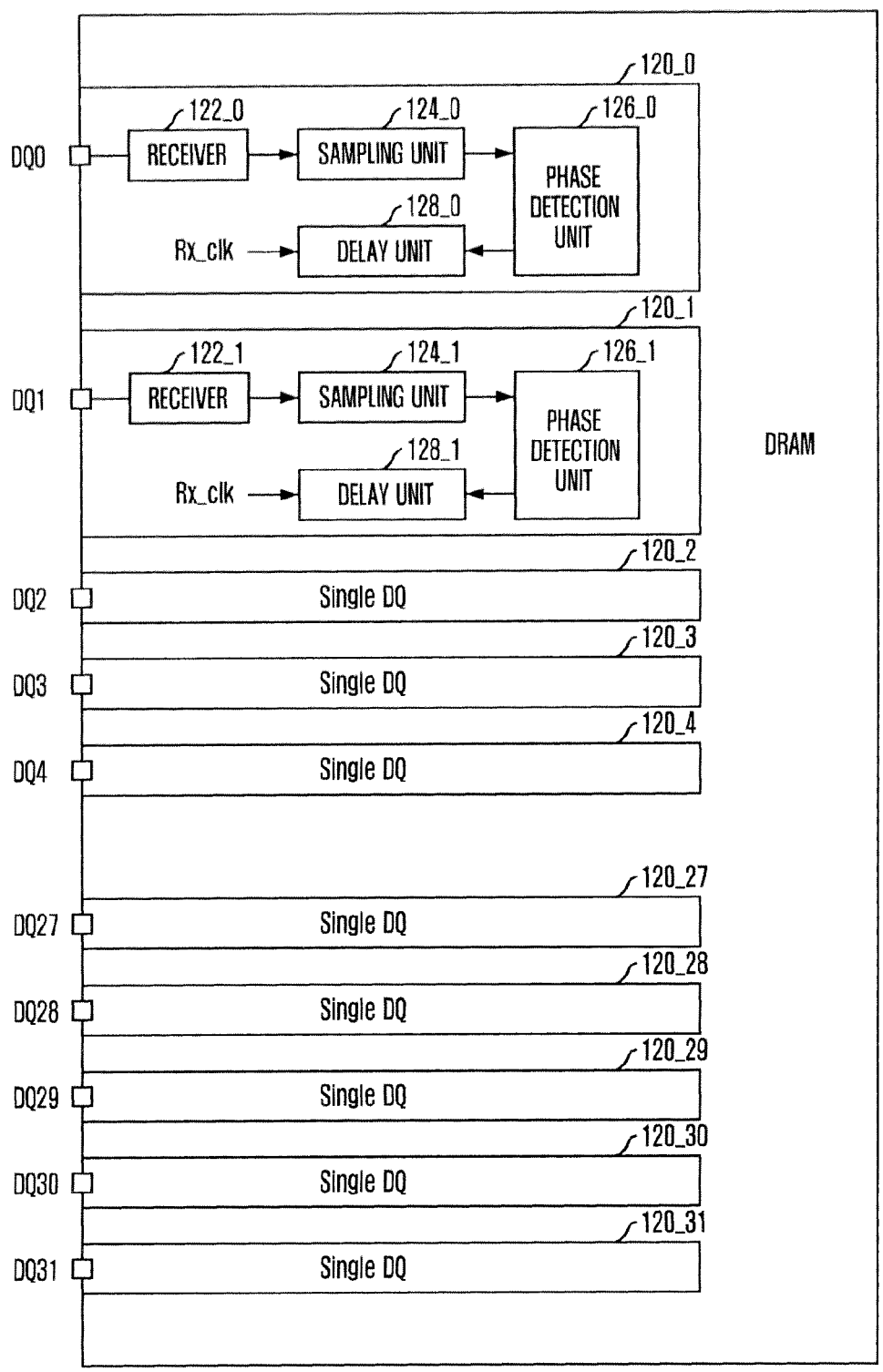
FIG. 1 is a block diagram illustrating a conventional semiconductor memory device including clock data recovery (CDR) circuits.

In the semiconductor memory device of FIG. 1, each of the CDR circuits 120_0 to 120_31 connected to the data pads DQ0 to DQ31 can adjust a receiving time of input data. However, in the current embodiment shown in FIG. 2A, the semiconductor memory apparatus receives signals (or data) and informs the data processing apparatus of a transmission state of the signals, and then the data processing apparatus adjusts times for transferring the next signals to the semiconductor memory apparatus.

In detail, referring to FIG. 2A, the semiconductor memory apparatus includes first to thirty second signal phase detection units 220_0 to 220_31 and a notification unit. The signal phase detection units 220_U to 220_31 receive signals from the data processing apparatus through first to thirty second input/output pads DQ0 to DQ31 and transfer the signals. In addition, the signal phase detection units 220_0 to 220_31 detect the phases of the received signals. The notification unit transfers output signals of the signal phase detection units 220_0 to 220_31 to the data processing apparatus for informing the data processing apparatus of a signal transmission state of the signals. The notification unit includes a serialization unit 280 and a transmission unit 290. The serialization unit 280 serializes signals received from the signal phase detection units 220_0 to 220_31, and the serialized signals are transferred to the data processing apparatus through the transmission unit 290.

The first to thirty second signal phase detection units 220_0 to 220_31 have the same structure. Thus, only the first signal phase detection unit 220_0 will now be described, and descriptions of the second to thirty second signal phase detection units 220_1 to 220_31 will be omitted for conciseness. The first signal phase detection units 220_0 include a receiver 222_0, a sampling unit 224_0, and a phase detection unit 226_0. The receiver 222_0 receives signals input through the first input/output pad DQ0. The sampling unit 224_0 transfers the signals received from the receiver 222_0 to the phase detection unit 226_0 according to a receiving reference clock RX_CLK. The phase detection unit 226_0 detects phases of the signals received from the sampling unit 224_0.

In operation, the receiver 222_0 receives signals through the first input/output pad DQ0 and transfers the signals to the sampling unit 224_0. The sampling unit 224_0 transfers the signals received from the receiver 222_0 to the phase detection unit 226_0 according to a receiving reference clock RX_CLK. The phase detection unit 226_0 detects transition time points of the signals received from the sampling unit 224_0 (that is, time points at which successively transferred signals change from a logic high level to a logic low level, or from a logic low level to a logic high level). Then, the phase detection unit 226_0 transfers the signals to the serialization unit 280. In this way, signals are transferred to the serialization unit 280 from the first signal phase detection unit 220_0 and the other second to thirty second signal phase detection units 220_1 to 220_31. Then, the serialization unit 280 serializes the signals and transfers the serialized signals to the data processing apparatus through the transmission unit 290. The data processing apparatus detects a signal transmission state from the serialized signals received through the transmission unit 290. Then, the data processing apparatus adjusts signal output times based on the detected signal transmission state.

The data processing apparatus includes a receiving unit 540 and first to thirty second signal transmission determination units 520_0 to 520_31. The receiving unit 540 receives serialized signals transferred through the transmission unit 290. The signal transmission determination units 520_0 to 520_31 analyze signals output from the receiving unit 540 for detecting a signal transmission state and determining a delay value according to the detection result. Each of the signal transmission determination units 520_0 to 520_31 includes a delay unit and an output unit Tx. The delay unit is configured to delay output of new signals, and the output unit Tx outputs delayed new signals under control of the delay unit. That is, unlike a conventional semiconductor memory device, the data processing apparatus adjusts output times of new signals according to serialized signals received from the semiconductor memory apparatus so that high-speed signals and data transmission can be stabilized.

FIG. 2B is a flowchart for explaining operations of the semiconductor memory apparatus and the data processing apparatus of FIG. 2A, in accordance with an embodiment of the present invention.

Referring to FIG. 2B, clock data can be recovered as follows. In operation 5202, the semiconductor memory apparatus detects phases of input signals. In operation 5203, the signals are combined. In operation S204, the combined signals are sent to the data processing apparatus. In operation S205, the data processing apparatus detects a signal transmission state of the signal and decreases or increases a delay value for adjusting output times of new signals.

Figure 3A:
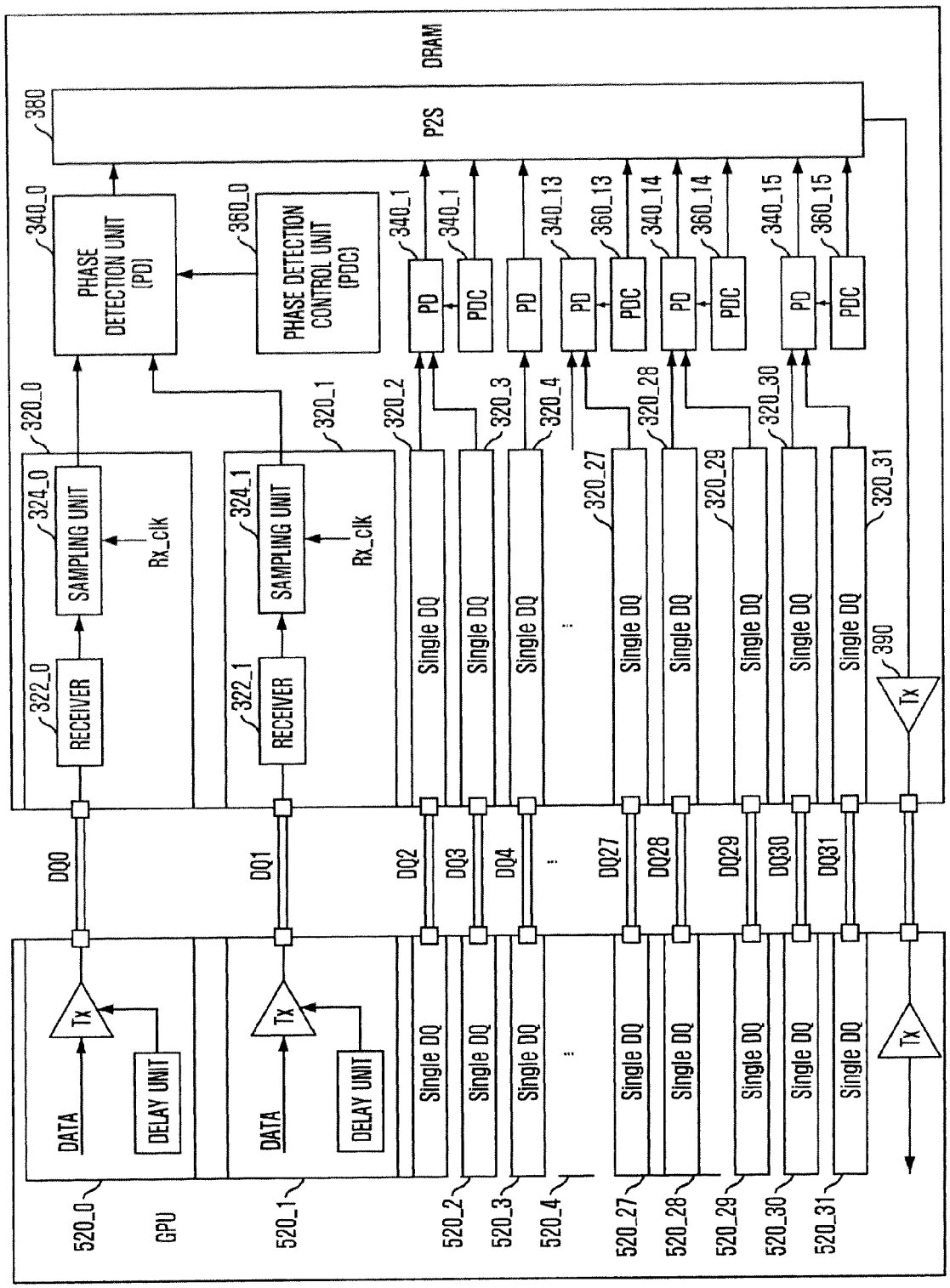
FIG. 3A is a block diagram illustrating a semiconductor memory apparatus and a data processing apparatus in accordance with another embodiment of the present invention.

FIG. 3A is a block diagram illustrating a semiconductor memory apparatus and a data processing apparatus in accordance with another embodiment of the present invention.

Referring to FIG. 3A, the data processing apparatus has the same structure as the data processing apparatus depicted in FIG. 2A. However, in the semiconductor memory apparatus of 3A, a plurality of phase detection units 340_0 to 340_15 are shared by neighboring signal phase detection units 320_0 to 320_31.

In detail, the semiconductor memory apparatus includes a plurality of signal receiving units 320_0 to 320_31, the plurality of phase detection units 340_ to 340_15, a plurality of phase detection control units 360_0 to 360_15, and a notification unit. The signal receiving units 320_0 to 320_31 receive signals from the data processing apparatus through a plurality of input/output pads DQ0 to DQ31 and transfer the signals according to a receiving reference clock RX_CLK. The signal receiving units 320_0 to 320_31 are divided into groups. The phase detection units 340_0 to 340_15 receive outputs of the groups of the signal receiving units 320_0 to 320_31 for detecting phases of the outputs. The phase detection control units 360_0 to 360_15 control the phase detection units 340_0 to 340_15 to sequentially detect the phases of the outputs of the groups of the signal receiving units 320_0 to 320_31. The notification unit transfers outputs of the phase detection units 340_0 to 340_15 to the data processing apparatus so as to allow the data processing apparatus to detect a signal transmission state. The notification unit includes a serialization unit 380 and a transmission unit 390. The serialization unit 380 serializes signals received from the phase detection units 340_0 to 340_15, and the serialized signals are transferred to the data processing apparatus through the transmission unit 390.

The signal receiving units 320_0 to 320_31 have the same structure. Thus, only the first signal receiving unit 320_0 will now be described, and descriptions of the second to thirty second signal receiving units 320_1 to 320_31 will be omitted. The first signal receiving unit 320_0 includes a receiver 322_0 and a sampling unit 324_0. The receiver 322_0 receives signals input through the first input/output pad DQ0. The sampling unit 324_0 transfers signals according to a receiving reference clock RX_CLK.

Signals input through the input/output pads DQ0 to DQ31 are recognized and transferred by the plurality of signal receiving units 320_0 to 320_31 corresponding to the input/output pads DQ0 to DQ31. Signals output from the neighboring two of the signal receiving units 320_0 to 320_31 are transferred to a corresponding one of the phase detection units 340_0 to 340_15 that are controlled by the phase detection control units 360_0 to 360_15. That is, two input/output pads share one phase detection unit. The phase detection control units 360_0 to 360_15 control the phase detection units 340_0 to 340_15 to detect the phases of signals output from the even or odd numbered signal receiving units 320_0 to 320_31. Therefore, in accordance with the current embodiment, the semiconductor memory apparatus can have a reduced CDR circuit area as compared with the semiconductor memory apparatus of FIG. 2A.

Figure 3B:
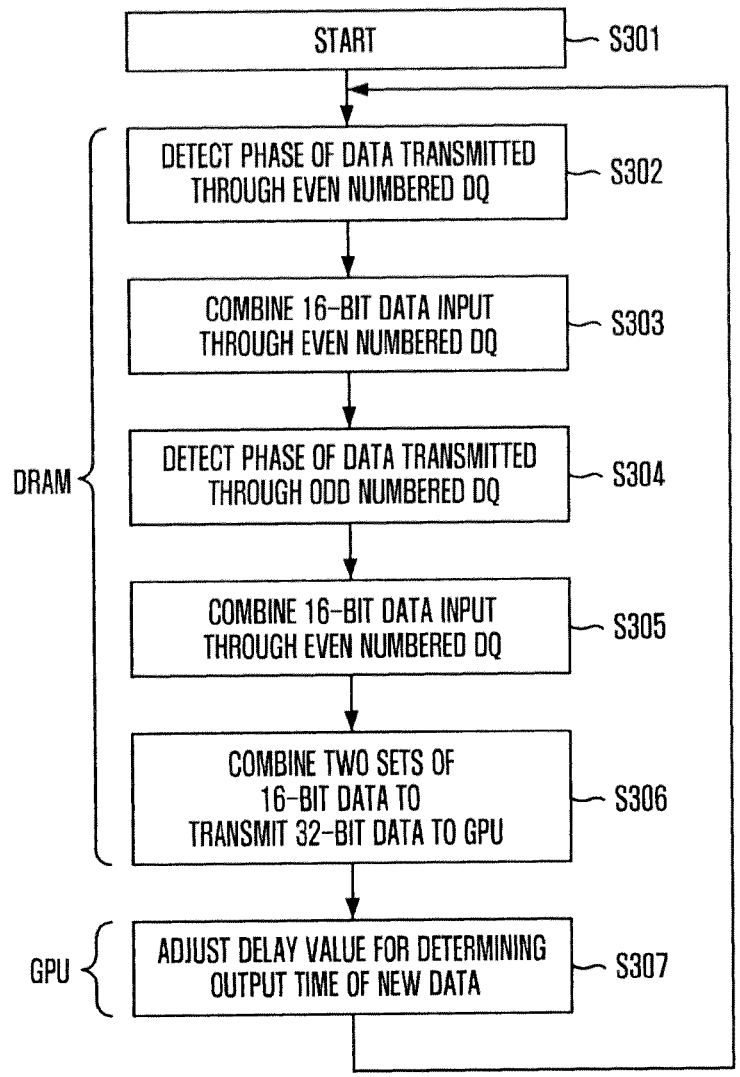
FIG. 3B is a flowchart for explaining operations of the semiconductor memory apparatus and the data processing apparatus of FIG. 3A, in accordance with an embodiment of the present invention.

FIG. 3B is a flowchart for explaining operations of the semiconductor memory apparatus and the data processing apparatus of FIG. 3A, in accordance with an embodiment of the present invention.

Referring to FIG. 3B, clock data can be recovered as follows. In operation S302, the semiconductor memory apparatus detects the phases of signals input through even numbered input/output pads. In operation S303, the signals input through the even numbered input/output pads are combined. In operation S304, the semiconductor memory apparatus detects the phases of signals input through odd numbered input/output pads. In operation S305, the signals input through the odd numbered input/output pads are combined. In operation S306, the signals combined in operations S303 and S305 are serialized and transferred to the data processing apparatus. In operation S307, the data processing apparatus detects a signal transmission state and decreases or increases a delay value for controlling output times of new signals.

Figure 4:
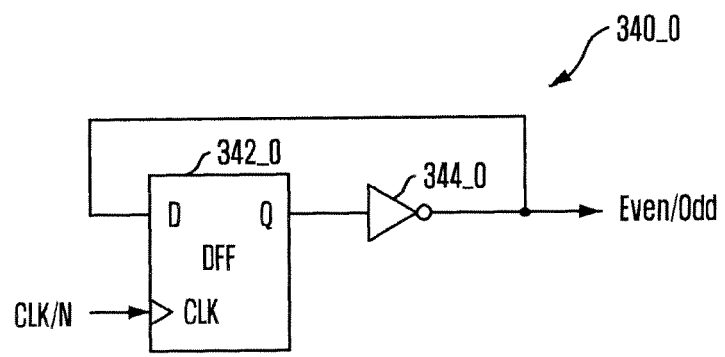
FIG. 4 is a circuit diagram illustrating a phase detection control unit of the semiconductor memory apparatus of FIG. 3A, in accordance with an embodiment of the present invention.

FIG. 4 is a circuit diagram illustrating the phase detection control unit 360_0 of FIG. 3A, in accordance with an embodiment of the present invention. The phase detection control units 360_0 to 360_15 of the semiconductor memory apparatus of FIG. 3A have the same structure. Thus, only the first phase detection control unit 360_0 will now be described.

Referring to FIG. 4, the phase detection control unit 360_0 includes a flip-flop 362_0 and an inverter 364_0. The flip-flop 362_0 receives a signal and outputs the signal according to a first clock CLK/N produced by dividing a system clock by a predetermined value. The inverter 364_0 inverts the signal output from the flip-flop 362_0 and returns the inverted signal to an input of the flip-flop 362_0 to generate a pulse signal having a width corresponding to a rising edge of the first clock CLK/N for controlling the phase detection unit 340_0. The phase detection unit 340_0 detects the phase of a signal output from the first signal receiving unit 320_0 or the second signal receiving unit 320_1 and sends the signal to the serialization unit 380. In FIG. 4, N is a natural number selected for recognizing signals output from two input/output pads.

Figure 5:
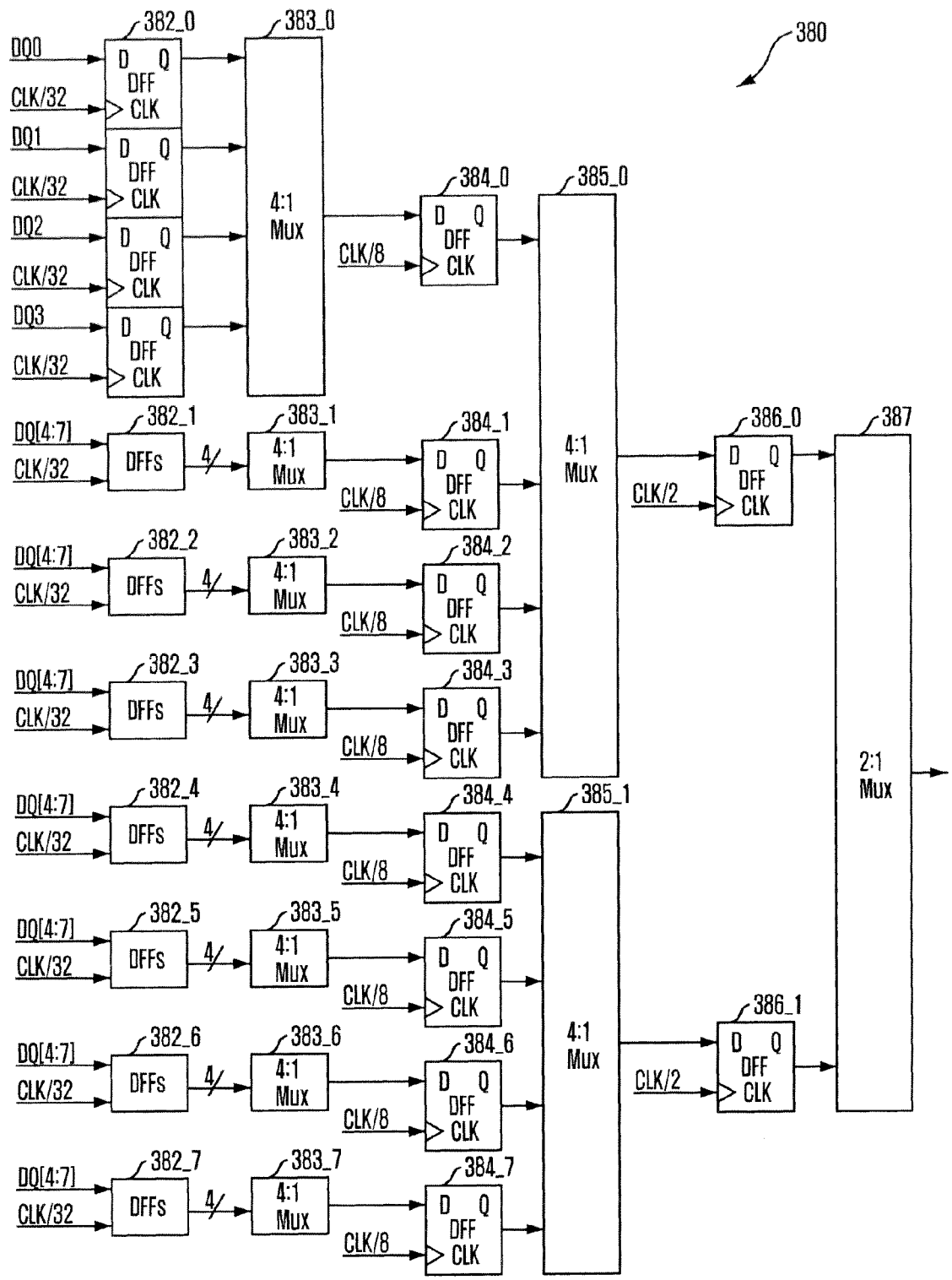
FIG. 5 is a circuit diagram illustrating a serialization unit of the semiconductor memory apparatus of FIG. 3A, in accordance with an embodiment of the present invention.

FIG. 5 is a circuit diagram illustrating the serialization unit 380 of FIG. 3A, in accordance with an embodiment of the present invention.

Referring to FIG. 5, the serialization unit 380 includes a plurality of flip-flops 382_0 to 382_7, 384_0 to 384_7, 386_0, and 3861, and a plurality of multiplexers 383_0 to 383_7, 385_0, 385_1, and 387. The flip-flops 382_0 to 382_7, 384_0 to 384_7, 386_0, and 386_1 receive signals from the phase detection units 340_0 to 340_15 and transfer the signals according to division clocks produced by dividing a reference clock by a predetermined value. The multiplexers 383_0 to 383_7, 385_0, 385_1, and 387 receive signals output from the flip-flops 382_0 to 382_7, 384_0 to 384_7, 386_0, and 386_1 and transfer the signals sequentially.

In detail, the flip-flops 382_0 to 382_7, 384_0 to 384_7, 386_0, and 386_1 of the serialization unit 380 can be grouped into first flip-flops 382_0 to 382_7, second flip-flops 384_0 to 384_7, and third flip-flops 386_0 and 386_1. The multiplexers 383_0 to 383_7, 385_0, 385_1, and 387 of the serialization unit 380 can be grouped into first multiplexers 383_0 to 383_7, second multiplexers 385_0 and 385_1, and a third multiplexer 387. The first flip-flops 382_0 to 382_7 receive data from input/output pads DQ0 to DQ3, DQ4 to DQ7, . . . , and DQ28 to DQ31, respectively, and transfer the signals according to a first division clock CLK/32 produced by dividing a system clock by 32. The first multiplexers 383_0 to 383_7 receive signals from the first flip-flops 382_0 to 382_7 and output the signals sequentially. Here, each of the first multiplexers 383_U to 33_7 receive four signals from each of the first flip-flops 382_U to 382_7. The second flip-flops 384_U to 384_7 receive signals output from the first multiplexers 383_0 to 383_7 and transfer the signals according to a second division clock CLK/8 produced by dividing the system clock by 8. The second multiplexers 385_0 and 3851 receive signals output from the second flip-flops 384_0 to 384_7 and output the signals sequentially. Here, each of the second multiplexers 385_0 and 3851 receive four signals. The third flip-flops 386_0 and 386_1 receive signals output from the second multiplexers 385_0 to 385_1 and transfer the signals according to a third division clock CLK/2 produced by dividing the system clock by 2. The third multiplexer 387 receives signals output from the third flip-flops 386_0 and 386_1 and outputs the signals sequentially.

As described above, the serialization unit 380 can serialize signals output from the first to thirty second input/output pads DQ0 to DQ31 using the flip-flops 382_0 to 382_7, 384_0 to 384_7, and 3860 and 386_1, and the multiplexers 383_0 to 383_7, 385_0, 385_1, and 387. In addition, according to the number of input/output pads, the structure of the serialization unit 380 can be varied, and the division clocks can be varied.

In accordance with the present invention, signal input/output channels of the semiconductor memory apparatus are grouped, and each of the groups shares a CRD circuit. Therefore, the area of the semiconductor memory apparatus occupied by the CRD circuits can be reduced, and thus the semiconductor memory apparatus can be highly integrated.

Moreover, in accordance with the present invention, the CDR circuit can be usefully used in a semiconductor memory apparatus, an electronic device, or an electronic system for reducing the number of components and power consumption.

While the present invention has been described with respect to the specific embodiments, it will be apparent to those skilled in the art that various changes and modifications may be made without departing from the spirit and scope of the invention as defined in the following claims.

What is claimed is:

1. A method for recovering clock data, comprising;
    generating a first serial signal by combining first signals received through even numbered input/output pads after detecting phases of the first signals;
    generating a second serial signal by combining second signals received through odd numbered input/output pads after detecting phases of the second signals;
    transferring a serialized signal produced by combining the first and second serial signals; and
    adjusting output times of new signals based on a signal transmission state detected using the serialized signal.

2. The method as recited in claim 1, wherein the generating of the first serial signal comprises:
    receiving first signals transferred through the even numbered input/output pads;
    transferring the first signals according to a receiving reference clock;
    detecting phases of the first signals; and
    generating a first serial signal by combining the first signals.

3. The method as recited in claim 1, wherein the adjusting of the output times of the new signals comprises:
    receiving the serialized signal;
    determining a delay value after detecting a signal transmission state by analyzing the serialized signal;
    delaying output of new signals according to the determined delay value; and
    outputting the delayed new signals.

* * * * *